US011296241B2

(12) United States Patent
Azuma et al.

(10) Patent No.: US 11,296,241 B2
(45) Date of Patent: Apr. 5, 2022

(54) LIGHT DETECTOR HAVING MONITORING SINGLE PHOTON AVALANCHE DIODE (SPAD)

(71) Applicant: DENSO CORPORATION, Kariya (JP)

(72) Inventors: Kenta Azuma, Kariya (JP); Teiyu Kimura, Kariya (JP); Noriyuki Ozaki, Kariya (JP); Shinji Kashiwada, Kariya (JP); Takehiro Hata, Kariya (JP); Isamu Takai, Nagakute (JP); Hiroyuki Matsubara, Nagakute (JP)

(73) Assignee: DENSO CORPORATION, Kariya (JP)

( * ) Notice: Subject to any disclaimer, the term of this patent is extended or adjusted under 35 U.S.C. 154(b) by 53 days.

(21) Appl. No.: 16/583,674

(22) Filed: Sep. 26, 2019

(65) Prior Publication Data

US 2020/0044098 A1 Feb. 6, 2020

Related U.S. Application Data

(63) Continuation of application No. PCT/JP2018/013818, filed on Mar. 30, 2018.

(30) Foreign Application Priority Data

Mar. 31, 2017 (JP) .............................. JP2017-071412
Feb. 13, 2018 (JP) .............................. JP2018-022999

(51) Int. Cl.
H01L 31/02 (2006.01)
H01L 31/10 (2006.01)
G01S 7/486 (2020.01)
H03F 3/08 (2006.01)

(52) U.S. Cl.
CPC ........ *H01L 31/02027* (2013.01); *G01S 7/486* (2013.01); *H01L 31/10* (2013.01); *H03F 3/08* (2013.01)

(58) Field of Classification Search
CPC combination set(s) only.
See application file for complete search history.

(56) References Cited

U.S. PATENT DOCUMENTS 5,548,112 A * 8/1996 Nakase ................. H01L 31/107
                                                     250/214 C
5,578,815 A * 11/1996 Nakase ..................... G05F 3/18
                                                     250/214 C
2012/0248295 A1 10/2012 Ito et al.
(Continued)

FOREIGN PATENT DOCUMENTS

JP        5211095 B2   6/2013
WO   2018181307 A1  10/2018

*Primary Examiner* — Michael Jung
(74) *Attorney, Agent, or Firm* — Maschoff Brennan

(57) ABSTRACT

A light detector is provided to include a detection module, and a monitoring SPAD. The detection module includes an SPAD that is an avalanche photodiode operable in Geiger mode; the detection module is configured to perform light detection by applying, to the SPAD, a reverse bias voltage in a reverse direction. The monitoring SPAD has characteristics identical to characteristics of the SPAD in the detection module. The reverse bias voltage is generated to be applied to the SPAD in the detection module based on (i) a reference breakdown voltage set from a breakdown voltage generated across the monitoring SPAD in Geiger mode and (ii) a predetermined excess voltage.

16 Claims, 3 Drawing Sheets

(56) References Cited

U.S. PATENT DOCUMENTS

| | | | |
|---|---|---|---|
| 2013/0334411 A1* | 12/2013 | Brunel | H01L 31/02019 250/252.1 |
| 2014/0191115 A1* | 7/2014 | Webster | H01L 27/14609 250/214 R |
| 2017/0040368 A1* | 2/2017 | Grzesik | H01L 27/14621 |
| 2018/0180471 A1* | 6/2018 | Marra | G01J 1/44 |

* cited by examiner

LIGHT DETECTOR HAVING MONITORING SINGLE PHOTON AVALANCHE DIODE (SPAD)

CROSS REFERENCE TO RELATED APPLICATIONS

The present application is a continuation application of International Patent Application No. PCT/JP2018/013818 filed on Mar. 30, 2018, which designated the U.S. and claims the benefit of priority from Japanese Patent Application No. 2017-071412 filed on Mar. 31, 2017 and Japanese Paten Application No. 2018-022999 filed on Feb. 13, 2018. The entire disclosures of all of the above applications are incorporated herein by reference.

TECHNICAL FIELD

The present disclosure relates to a light detector that utilizes an avalanche effect.

BACKGROUND

There is known a technology of a light detector using an avalanche photodiode (hereinafter referred to as APD). Further, there is a light detector that operates the APD in Geiger mode. The APD operating in Geiger mode is called SPAD, which is an abbreviation of Single Photon Avalanche Diode. The SPAD used by the light detector breaks down in response to the incidence of photons, and the light detector is configured to output a pulse signal in response to that the SPAD breaks down. The breakdown voltage of the SPAD changes with temperature.

SUMMARY

According to an embodiment of the present disclosure, a light detector is provided to include a detection module, and a monitoring SPAD.

The detection module includes an SPAD that is an avalanche photodiode operable in Geiger mode; the detection module is configured to perform light detection by applying, to the SPAD, a reverse bias voltage in a reverse direction. The monitoring SPAD has characteristics identical to characteristics of the SPAD in the detection module. The reverse bias voltage is generated to be applied to the SPAD in the detection module based on (i) a reference breakdown voltage set from a breakdown voltage generated across the monitoring SPAD in Geiger mode and (ii) a predetermined excess voltage.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Hereinafter, embodiments of the present disclosure will be described with reference to the drawings.

First Embodiment

Figure 1:
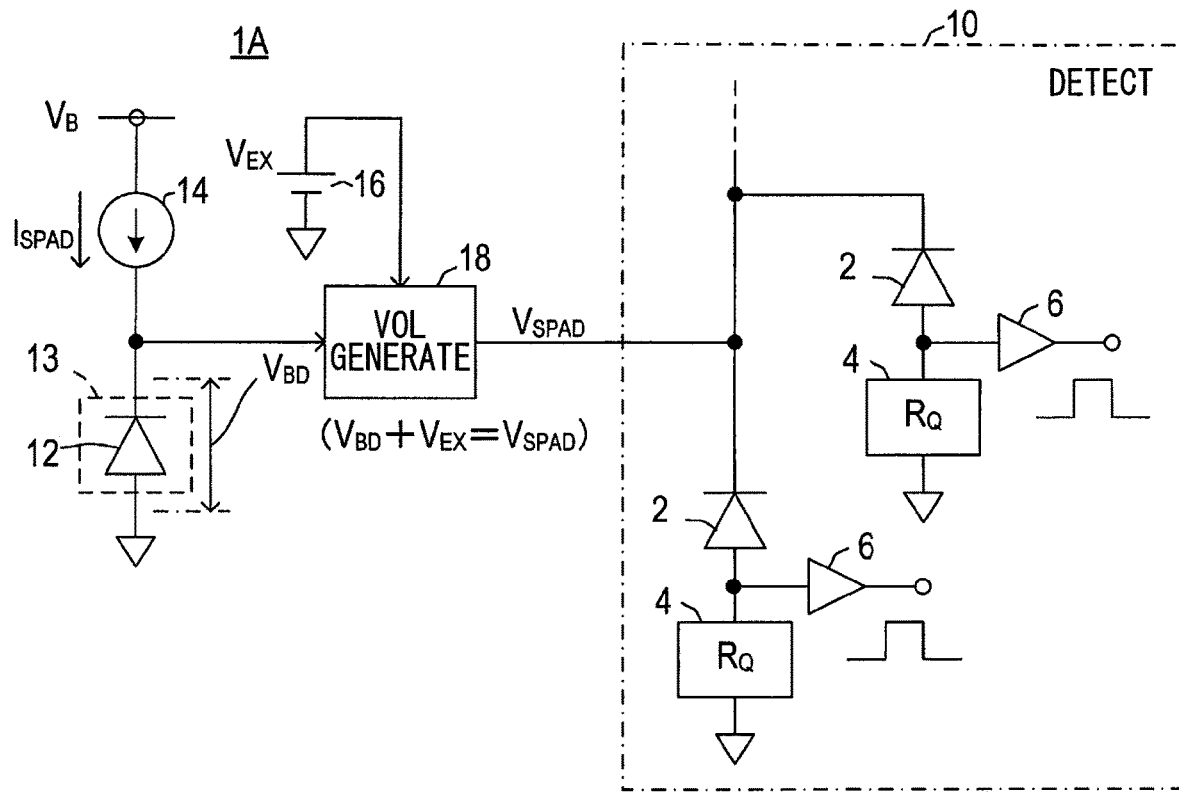
FIG. 1 is a block diagram showing a configuration of a light detector according to a first embodiment.

As shown in FIG. 1, a light detector 1A according to a first embodiment includes (i) a detection module 10 including a plurality of SPADs 2 and (ii) a monitoring SPAD 12 having the same configuration and the same characteristics as the SPAD 2 in the detection module 10. For instance, "module", which may also be referred to as a circuit, may be configured to include circuitry (hardware circuit) as also described later in each description of the "module". However, there is no need to be limited thereto. That is, "module" may be also configured to include a central processing unit (CPU) along with memory storing instructions executed by the CPU, or both the circuitry and the CPU along with memory.

The SPAD 2 and the monitoring SPAD 12 each are an APD operable in Geiger mode as described above. In the detection module 10, quenching resistors 4 are connected in series to the anodes of the plurality of SPADs 2, respectively.

The quenching resistor 4 generates a voltage drop due to the current flowing in the SPAD 2 when photons are incident on the SPAD 2 and the SPAD 2 breaks down, thereby stopping the Geiger discharge of the SPAD 2. The quenching resistor 4 may be configured by a "resistor" which is a so-called common passive element, or may be configured by an active element such as a "transistor". The quenching resistor 4 may also be referred to as a quenching element.

Then, in the detection module 10, each SPAD 2 breaks down, and the current generated in the quenching resistor 4 causes the voltage generated across the quenching resistor 4 to be input to a pulse converter 6 corresponding to each SPAD 2.

The pulse converter 6 is for outputting a pulse signal having a predetermined pulse width as a detection signal when photons are incident on the corresponding SPAD 2. When the voltage across the quenching resistor 4 is equal to or higher than a predetermined voltage, the pulse converter 6 generates a digital pulse "1".

Note that in order to operate the detection module 10, it is necessary to apply a reverse bias voltage $V_{SPAD}$ higher than the breakdown voltage to each SPAD 2 in the (reverse) direction reverse to the forward direction. When the reverse bias voltage $V_{SPAD}$ is constant, the detection sensitivity of each SPAD 2 changes with temperature.

Therefore, in the present embodiment, the breakdown voltage of the SPAD 2 is estimated as a reference breakdown voltage $V_{BD}$ by using the monitoring SPAD 12 placed under the same environment as the detection module 10. Then, based on the reference breakdown voltage $V_{BD}$ and a predetermined excess voltage $V_{EX}$, a reverse bias voltage $V_{SPAD}$ is generated and applied to the cathode of each SPAD 2 in the detection module 10.

Therefore, the light detector 1A includes (i) a current source 14 for supplying a constant current to the monitoring SPAD 12, (ii) a voltage source 16 for generating an excess voltage $V_{EX}$, and (iii) a voltage generation module 18 for generating a reverse bias voltage $V_{SPAD}$.

The voltage generation module 18 is configured to generate the reverse bias voltage $V_{SPAD}$ by adding the breakdown voltage of the monitoring SPAD 12 as the reference breakdown voltage $V_{BD}$ to the excess voltage $V_{EX}$ from the voltage source 16.

The voltage generation module 18 only needs to generate the reverse bias voltage $V_{SPAD}$ based on the reference breakdown voltage $V_{BD}$ and the excess voltage $V_{EX}$ so that the excess voltage $V_{EX}$ is substantially constant; the respective voltages do not necessarily to be added directly.

Next, the current source 14 is capable of operating the monitoring SPAD 12 in Geiger mode by receiving the power supply voltage $V_B$ sufficiently higher than the breakdown voltage of the monitoring SPAD 12 and supplying a constant current $I_{SPAD}$ to the monitoring SPAD 12.

Note that the monitoring SPAD 12 is not connected to any quenching resistor like the SPAD 2 in the detection module 10. The monitoring SPAD 12 is configured to continue the current flow once it is broken down.

Therefore, the reference breakdown voltage $V_{BD}$, which changes according to the temperature of the monitoring SPAD 12, is always input to the voltage generation module 18. Since the monitoring SPAD 12 has the same characteristics as the SPAD 2 included in the detection module 10, the reference breakdown voltage $V_{BD}$ corresponds to the breakdown voltage of the SPAD 2.

Therefore, a voltage obtained by adding a predetermined excess voltage $V_{EX}$ to the reference breakdown voltage $V_{BD}$ corresponding to the breakdown voltage of each SPAD 2 is always applied as the reverse bias voltage $V_{SPAD}$ to the cathode of each SPAD 2 in the detection module 10.

Therefore, in the light detector 1A of the present embodiment, the detection sensitivity of each SPAD 2 in the detection module 10 becomes a constant detection sensitivity corresponding to the excess voltage $V_{EX}$ without being affected by the temperature change. Therefore, according to the present embodiment, the detection sensitivity of each of the SPADs 2 included in the detection module 10 can be temperature compensated, and the detection accuracy can be suppressed from changing due to the temperature.

Although the monitoring SPAD 12 may be configured to receive light from the outside, as shown by a dotted line in FIG. 1, the light shielding film 13 is provided to block the light from entering the monitoring SPAD 12.

Even in this case, since the monitoring SPAD 12 breaks down due to noise, the reference breakdown voltage $V_{BD}$ can be input to the voltage generation module 18. Further, in this case, since the reference breakdown voltage $V_{BD}$ does not change under the influence of light incident on the monitoring SPAD 12, the voltage generation module 18 can generate the reverse bias voltage $V_{SPAD}$ more stably.

Further, by disposing the monitoring SPAD 12 on the back side of the detection module 10, for example, the light incident on the monitoring SPAD 12 may be smaller than the light incident on the detection module 10. Also this case can provide substantially the same effect as in the case where the light shielding film 13 is provided on the monitoring SPAD 12.

Second Embodiment

Figure 2:
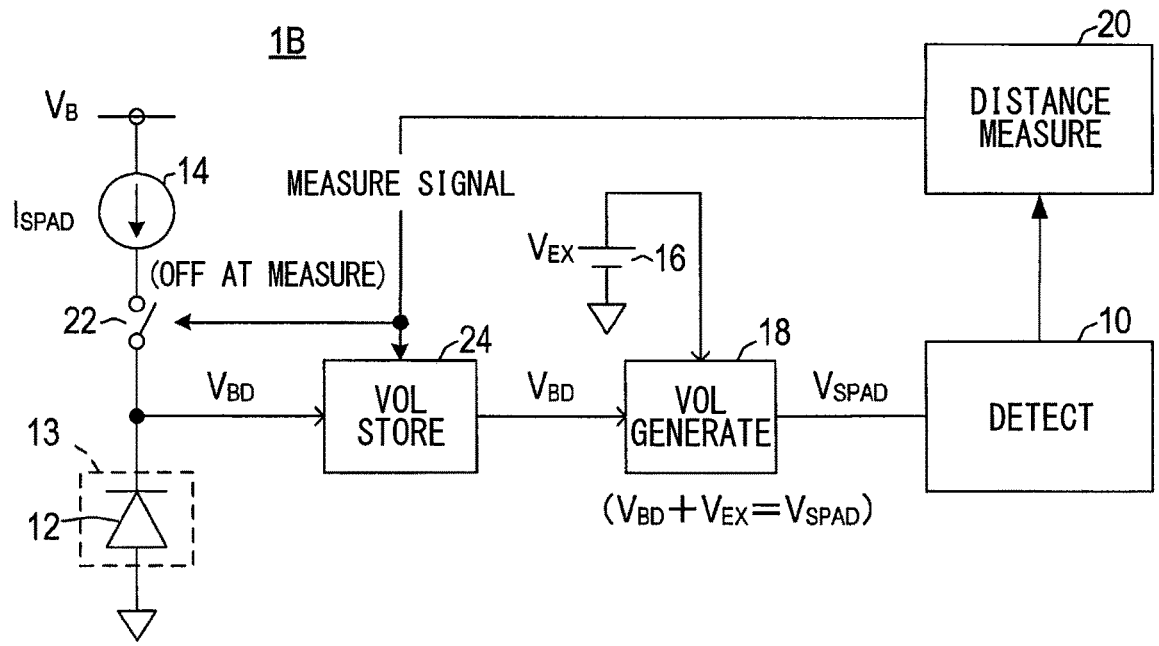
FIG. 2 is a block diagram showing a configuration of a light detector according to a second embodiment.

As shown in FIG. 2, the basic configuration of the light detector 1B of a second embodiment is the same as that of the light detector 1A of the first embodiment, and the difference from the first embodiment is the switch 22 and the voltage storage module 24 being added.

Therefore, in the present embodiment, the same elements as those in the first embodiment are denoted by the same reference signs in the drawings, and detailed descriptions thereof will be omitted.

As shown in FIG. 2, the switch 22 is provided in the conduction path from the current source 14 to the monitoring SPAD 12; the switch 22 conducts or shuts off the conduction path according to the distance measurement operation signal from the distance measurement apparatus 20 using the light detector 1B.

The switch 22 is in an OFF state when the distance measurement apparatus 20 is operating or performing distance measurement based on a detection signal from the detection module 10; in contrast, the switch 22 is in an ON state when the distance measurement apparatus 20 stops the distance measurement.

Therefore, when the distance measurement apparatus 20 stops the distance measurement, the monitoring SPAD 12 is supplied with current from the current source 14 and breaks down.

Therefore, when the distance measurement apparatus 20 stops the distance measurement, the voltage storage module 24 sets and stores the breakdown voltage of the monitoring SPAD 12 as a reference breakdown voltage $V_{BD}$, according to the distance measuring operation signal from the distance measurement apparatus 20.

Then, when the distance measurement apparatus 20 starts the distance measurement, the voltage storage module 24 outputs the stored reference breakdown voltage $V_{BD}$ to the voltage generation module 18, thereby permitting the voltage generation module 18 to generate the reverse bias voltage $V_{SPAD}$ corresponding to the latest reference breakdown voltage $V_{BD}$.

The storage of the reference breakdown voltage $V_{BD}$ by the voltage storage module 24 may be performed by latching the reference breakdown voltage $V_{BD}$ to a storage element by charging a capacitor or the like, or by digitizing the reference breakdown voltage $V_{BD}$ and storing it in a memory.

As described above, according to the light detector 1B of the present embodiment, the monitoring SPAD 12 is operated when the distance measurement apparatus 20, which is an external apparatus, stops the distance measurement. Therefore, when the detection module 10 is used for distance measurement operation, the operation of the monitoring SPAD 12 can be stopped; the increase in the power consumption of the light detector 1B due to the current flowing to the monitoring SPAD 12 can be suppressed.

The distance measurement apparatus 20 is mounted on a vehicle, and emits light for distance measurement forward in the traveling direction, and measures the distance to an obstacle present in front of the vehicle from the reflected light. The detection module 10 of this embodiment is thus used to receive the reflected light.

Note that in the present embodiment, the operations of the switch 22 and the voltage storage module 24 are switched according to the operation signal from the distance measurement apparatus 10; however, what switches the operations of the switch 22 and the voltage storage module 24 is not limited to the distance measurement apparatus 20. That is, the switch 22 and the voltage storage module 24 may operate in accordance with an instruction from an external apparatus that uses the detection signal from the detection module 10.

Third Embodiment

Figure 3:
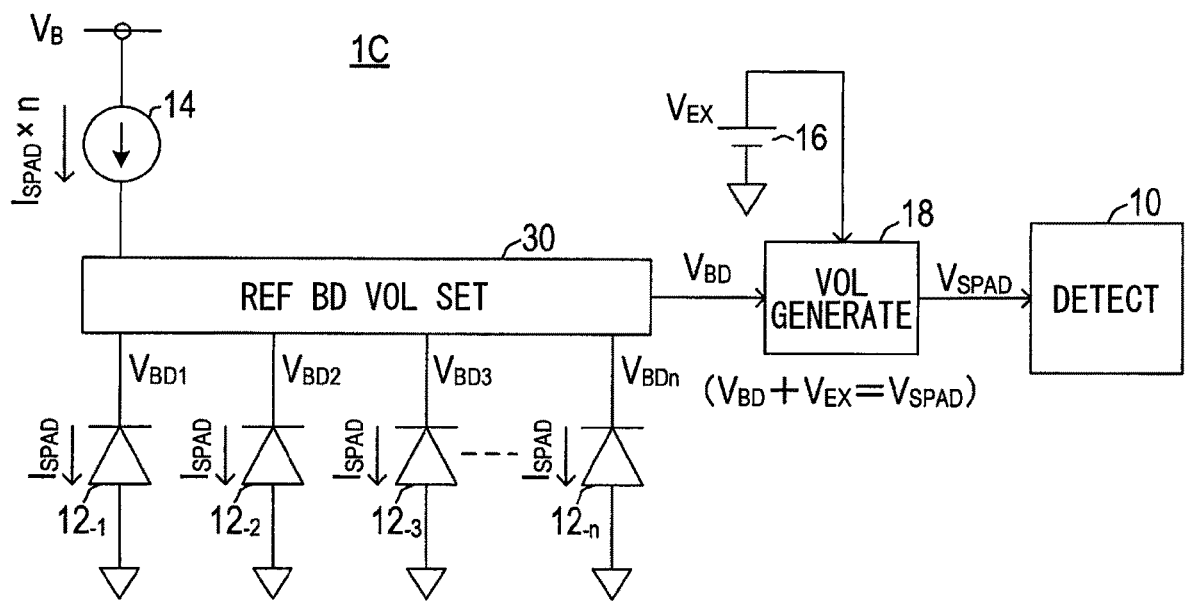
FIG. 3 is a block diagram showing a configuration of a light detector according to a third embodiment.

As shown in FIG. 3, the light detector 10 of a third embodiment has the same basic configuration as that of the light detector 1A of the first embodiment. The difference from the first embodiment is that a plurality of monitoring SPADs 12-1, 12-2, . . . , 12-n and a reference breakdown voltage setting module 30 (which may also be referred to as a calculation and selection module 30) of a reference breakdown voltage $V_{BD}$ are provided.

Therefore, in the present embodiment, the same elements as those in the first embodiment are denoted by the same reference signs in the drawings, and detailed descriptions thereof will be omitted. As shown in FIG. 3, in order to operate a plurality of monitoring SPADs 12-1, 12-2, . . . , 12-n in Geiger mode, the current source 14 is configured to supply n times the current $I_{SPAD}$ to be supplied to one monitoring SPAD (i.e., supply n×current $I_{SPAD}$ to a plurality of monitoring SPADs 12-1, 12-2, . . . , 12-n). Then, the supplied current is distributed to the plurality of monitoring SPADs 12-1, 12-2, . . . , 12-n, and each monitoring SPAD 12-1, 12-2, . . . , 12-n operates in Geiger mode.

Further, breakdown voltages $V_{BD1}$, $V_{BD2}$, . . . , $V_{BDn}$ of the monitoring SPADs 12-1, 12-2, . . . , 12-n are input to the reference breakdown voltage setting module 30; the reference breakdown voltage setting module 30 uses the breakdown voltages to generate the reference breakdown voltage $V_{BD}$ which is input to the voltage generation module 18.

The reference breakdown voltage setting module 30 selects a preset minimum value, maximum value, or median value from among a plurality of breakdown voltages $V_{BD1}$, $V_{BD2}$, . . . $V_{BDn}$, or calculates an average value, thereby generating the reference breakdown voltage $V_{BD}$ to be input to the voltage generation module 18.

This is because even if the monitoring SPAD 12 is configured to have the same characteristics as the SPAD 2, it is not possible to eliminate the variation in the characteristics. If the variation in the characteristics of the monitoring SPAD 12 is large, the appropriate reference breakdown voltage $V_{BD}$ cannot be input to the voltage generation module 18.

That is, in the present embodiment, the reference breakdown voltage $V_{BD}$ input to the voltage generation module 18 is generated using a plurality of monitoring SPADs 12. Even if there are some of the monitoring SPADs 12 having large variations, an appropriate reference breakdown voltage $V_{BD}$ can be generated.

Therefore, according to the present embodiment, the voltage generation module 18 can generate more appropriate reverse bias voltage $V_{SPAD}$. The detection sensitivity of the SPAD 2 in the detection module 10 can be temperature compensated more favorably.

The reference breakdown voltage setting module 30 is for generating more appropriate reference breakdown voltage $V_{BD}$ using a plurality of breakdown voltages $V_{BD1}$, $V_{BD2}$, . . . , $V_{BDn}$. In general, it is better to select the median from among a plurality of the breakdown voltages $V_{BD1}$, $V_{BD2}$, . . . , $V_{BDn}$.

Fourth Embodiment

Figure 4:
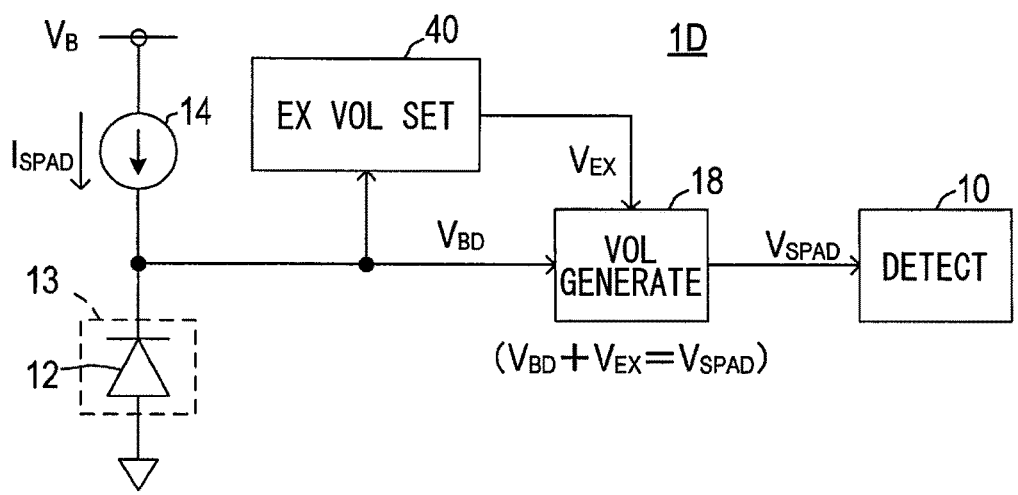
FIG. 4 is a block diagram showing a configuration of a light detector according to a fourth embodiment.

As shown in FIG. 4, the basic configuration of the light detector 1D of a fourth embodiment is the same as that of the light detector 1A of the first embodiment. The difference from the first embodiment is that an excess voltage setting module 40 (which may also be referred to as a voltage control module 40) is provided to set the excess voltage $V_{EX}$ to be added to the reference breakdown voltage $V_{BD}$ in the voltage generation module 18.

Therefore, in the present embodiment, the same elements as those in the first embodiment are denoted by the same reference signs in the drawings, and detailed descriptions thereof will be omitted. As shown in FIG. 4, the excess voltage setting module 40 is configured to take in the reference breakdown voltage $V_{BD}$ input to the voltage generation module 18, and set the excess voltage $V_{EX}$ based on the reference breakdown voltage $V_{BD}$.

This is because the characteristic of the SPAD 2 changes with temperature, so that it is conceivable that the excess voltage $V_{EX}$ should also be adjusted according to the temperature in order to control the detection sensitivity to a desired detection sensitivity.

That is, in the present embodiment, the reference breakdown voltage $V_{BD}$ is used as a detection signal of the temperature of the SPAD 2; the excess voltage $V_{EX}$ used to generate the reverse bias voltage $V_{SPAD}$ in the voltage generation module 18 is set according to the temperature.

As a result, also in the light detector 1D of this embodiment, as in the light detectors 1A to 1C of each of the above embodiments, the detection sensitivity of each of the SPADs 2 included in the detection module 10 can be temperature compensated; it is possible to suppress a change in detection accuracy due to temperature.

The excess voltage setting module 40 may be configured as a resistive voltage dividing circuit that changes the excess voltage $V_{EX}$ in proportion to the reference breakdown voltage $V_{BD}$, for example, by dividing the reference breakdown voltage $V_{BD}$ by resistance division.

Fifth Embodiment

Figure 5:
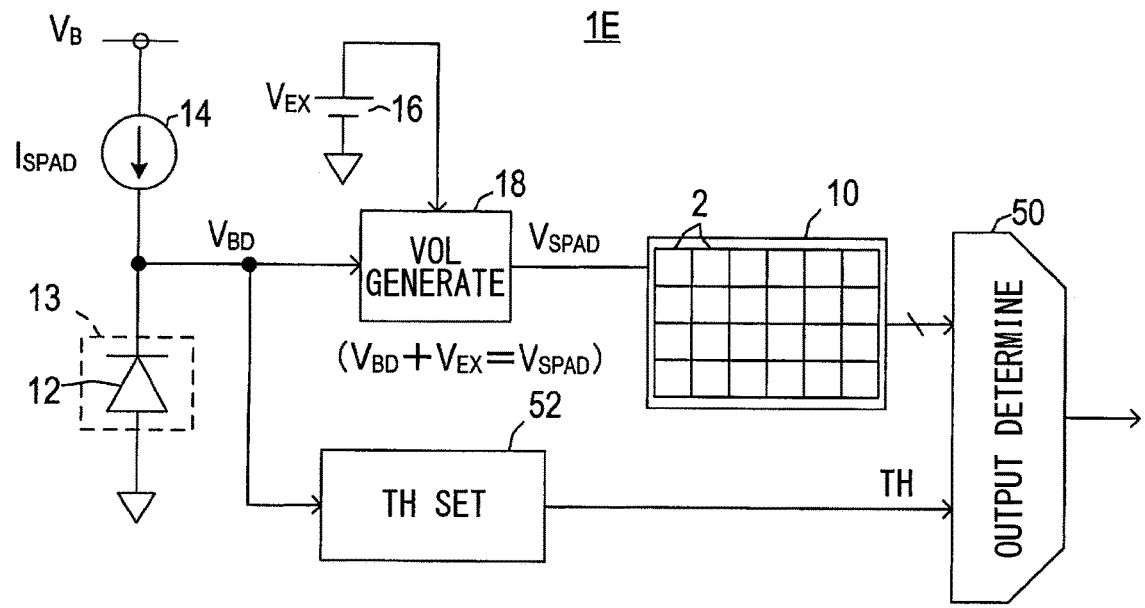
FIG. 5 is a block diagram showing a configuration of a light detector according to a fifth embodiment.

As shown in FIG. 5, the basic configuration of the light detector 1E of a fifth embodiment is the same as that of the light detector 1A of the first embodiment. The difference from the first embodiment is in (i) the configuration of the detection module 10 and (ii) addition of an output determination module 50 and a threshold setting module 52 (which may be also referred to as a threshold control module 52).

Therefore, in the present embodiment, the same elements as those in the first embodiment are denoted by the same reference signs in the drawings, and detailed descriptions thereof will be omitted. The detection module 10 is configured as a so-called light receiving array by arranging a plurality of SPADs 2 in a lattice.

Note that a quenching resistor 4 and a pulse converter 6 are connected to each of the plurality of SPADs 2 provided in the detection module 10 as in the case shown in FIG. 1. For this reason, when breakdown occurs due to photons entering each of the SPADs 2, digital pulses are output from the pulse converters 6 as detection signals.

The output determination module 50 counts the number (detection signal number) of detection signals respectively output from the plurality of SPADs 2 included in the detection module 10 through the pulse converters 6. When the count value is equal to or greater than a predetermined threshold value, it is determined that light is detected by the detection module 10.

This is because a certain SPAD 2 may be broken down due to noise and output a detection signal through the pulse converter 6. That is, the output determination module 50 uses the detection module 10 as one pixel for light detection. The output determination module 50 determines that light is detected by the detection module 10 when the number of SPADs 2 that output detection signals among the plurality of SPADs 2 in the detection module 10 is equal to or greater than a threshold value.

Then, when determining that light is detected by the detection module 10, the output determination module 50 outputs a trigger signal indicating that the light is detected by the detection module 10. In contrast, the threshold setting module 52 sets the threshold value used by the output determination module 50 for the determination based on the breakdown voltage of the monitoring SPAD 12.

This is because, in the present embodiment, the reverse bias voltage $V_{SPAD}$ applied to each SPAD 2 in the detection module 10 is generated by adding the predetermined excess voltage $V_{EX}$ to the reference breakdown voltage $V_{BD}$, so the operating voltage of each SPAD 2 changes.

That is, the reverse bias voltage $V_{SPAD}$ is set by adding a predetermined excess voltage $V_{EX}$ to the reference breakdown voltage $V_{BD}$. In this case, although the detection sensitivity of each SPAD 2 can be suppressed from decreasing due to temperature, the reverse bias voltage $V_{SPAD}$ applied to the SPAD 2 changes. Then, when the reverse bias voltage $V_{SPAD}$ increases, the dark current flowing in the SPAD 2 increases, and this dark current causes the SPAD 2 to be easily broken down.

Therefore, in the present embodiment, the threshold value is set according to the reference breakdown voltage $V_{BD}$ in order to suppress the decrease in the detection accuracy of light by the detection module 10 even if the SPAD 2 easily malfunctions due to the dark current.

Note that if the reference breakdown voltage $V_{BD}$ increases with the temperature increases, the reverse bias voltage $V_{SPAD}$ also increases and the SPAD 2 is easily malfunction. The threshold setting module 52 may be configured to increase the threshold value when the reference breakdown voltage $V_{BD}$ increases.

Sixth Embodiment

In the light detectors 1A to 1E according to the first to fifth embodiments, in the detection module 10, the quenching resistor 4 is connected to the anode of each SPAD 2. A detection signal is output from the connection point between the anode of each SPAD 2 and the corresponding quenching resistor 4 via the pulse converter 6.

Therefore, the voltage generation module 18 adds the reference breakdown voltage $V_{BD}$ and the predetermined excess voltage $V_{EX}$ to generate a reverse bias voltage $V_{SPAD}$ having a potential higher than that of the anode of each SPAD 2, and the reverse bias voltage $VS_{PAD}$ is applied to the cathode of each SPAD 2. For example, since the anode of SPAD 2 does not have a negative potential, the reverse bias voltage $V_{SPAD}$ is preferably a positive potential.

Figure 6:
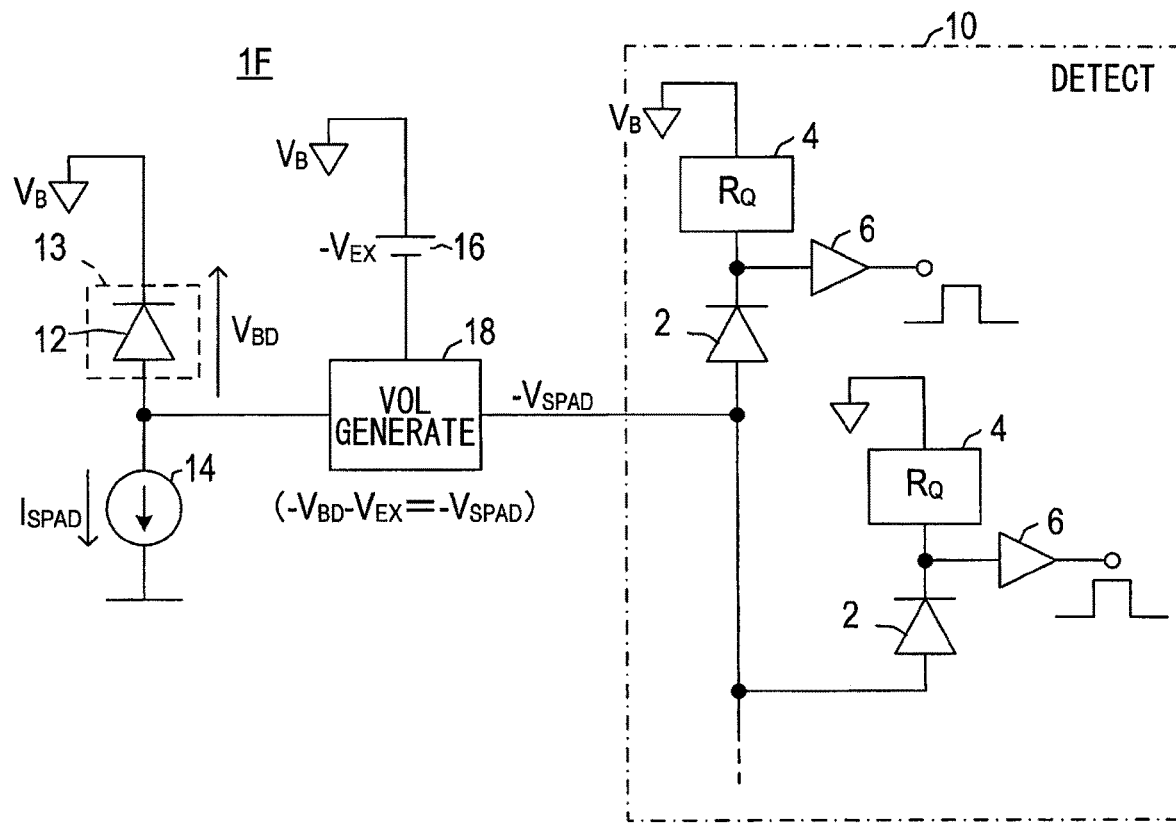
FIG. 6 is a block diagram showing a configuration of a light detector according to a sixth embodiment.

In contrast, in the light detector 1F of the present embodiment, as shown in FIG. 6, in the detection module 10, the quenching resistance 4 is connected to the cathode of each SPAD 2. The detection signal is output from the connection point between the cathode of each SPAD 2 and the corresponding quenching resistor 4 through the pulse converter 6.

Therefore, in the detection module 10, the power supply voltage $V_B$ is applied to the cathode of the SPAD 2 through the quenching resistor 4. In order to operate the SPAD 2 in Geiger mode, the potential of the anode of the SPAD 2 needs to be lower than that of the cathode by the reverse bias voltage.

Therefore, in the present embodiment, the power supply voltage $V_B$ is applied to the cathode of the monitoring SPAD 12 as in the SPAD 2 in the detection module 10. The current source 14 is connected to the anode of the monitoring SPAD 12 so as to flow current from the anode to the ground.

Then, the voltage generation module 18 takes in a negative reference breakdown voltage $-V_{BD}$ lower than the power supply voltage $V_B$ from the anode of the monitoring SPAD 12. A negative excess voltage $-V_{EX}$ obtained from the negative electrode side of the voltage source 16 is added to the negative reference breakdown voltage $-V_{BD}$.

As a result, in the voltage generation module 18, the negative reference breakdown voltage $-V_{BD}$ and the negative excess voltage $-V_{EX}$ are added. The reverse bias voltage $-V_{SPAD}$ is thereby generated which is lower in potential than the cathode of the SPAD 2. Then, the generated reverse bias voltage $-V_{SPAD}$ is applied to the anode of each SPAD 2 in the detection module 10. For example, in order not to make the cathode of the SPAD 2 have a negative potential, the reverse bias voltage $-V_{SPAD}$ is preferably a negative potential.

Therefore, also in the present embodiment, a reverse bias voltage $V_{SPAD}$ obtained by adding the excess voltage $V_{EX}$ to the reference breakdown voltage $V_{BD}$ is applied between the cathode and the anode of each SPAD 2 in the detection module 10. The same effect as that of the above embodiments can be obtained.

Although embodiments of the present disclosure have been described above, the present disclosure is not limited to the above-described embodiments, and various modifications can be made.

For example, in the first embodiment, it has been described that the monitoring SPAD 12 may be provided with the light shielding film 13 for blocking or suppressing the incidence of light. Also in the second to fifth embodiments, the light shielding film 13 may be provided on the monitoring SPAD 12 to shielding light. In addition, in the case of shielding the monitoring SPAD 12, it is not necessary to provide the light shielding film 13 as long as light can be prevented from being incident on the monitoring SPAD 12.

In each of the above embodiments, the detection module 10 has been described as being provided with a plurality of SPADs 2. Even in the case where one SPAD 2 is provided in the detection module 10, the reduction in the detection sensitivity of the detection module 10 can be suppressed if configured as in the above-described embodiments.

A plurality of functions of one element in the above embodiments may be implemented by a plurality of elements, or one function of one element may be implemented by a plurality of elements. Further, a plurality of functions of a plurality of elements may be implemented by one element, or one function implemented by a plurality of elements may be implemented by one element. A part of the configuration of the above embodiment may be omitted. At least a part of the configuration of the above embodiments may be added to or replaced with the configuration of another one of the above embodiments.

For reference to further explain features of the present disclosure, the description is added as follows.

A related art discloses a technology of a light detector using an avalanche photodiode (hereinafter referred to as APD). The technology performs temperature compensation of the APD by using a reverse biased reference junction structure which has a temperature characteristic of the current amplification factor that is almost the same as that of the APD.

This light detector uses a transistor having a current injection junction structure for injecting a reference current into the reference junction structure, and controls a multiplication factor of the APD by controlling the voltage applied to the APD and the reference junction structure so as to keep the amplification factor of the reference current at a predetermined value.

The above technology performs the temperature compensation control of the APD by controlling the multiplication factor of the APD. It is thus effective in the linear mode operated by applying a reverse bias voltage less than the breakdown voltage to the APD.

In contrast, the inventor's detailed investigation has found an issue of the above technology being inapplicable to a light detector that operates an APD in Geiger mode. That is, the APD operating in Geiger mode is called SPAD, and the reverse bias voltage is set to a voltage value higher than the breakdown voltage. Note that SPAD is an abbreviation of Single Photon Avalanche Diode.

The SPAD used by the light detector breaks down in response to the incidence of photons, and the light detector is configured to output a pulse signal having a predetermined pulse width in response to that the SPAD breaks down.

Therefore, the output of the light detector using SPAD is "1" or "0"; this type of light detector has no concept of controlling the multiplication factor. For this reason, it is difficult to temperature compensate the detection sensitivity of an SPAD by using the above technique.

It is thus desired to provide a technology to enable temperature compensation for detection sensitivity of an SPAD, more specifically, the photon detection sensitivity of the SPAD in a light detector using the SPAD.

Embodiments of the present disclosure described herein are set forth in the following clauses.

According to an embodiment of the present disclosure, a light detector is provided to include a detection module, a monitoring SPAD, a current source, and a voltage generation module.

The detection module includes an SPAD that is an avalanche photodiode operable in Geiger mode; the detection module is configured to perform light detection by applying, to the SPAD, a reverse bias voltage in a reverse direction. The monitoring SPAD has characteristics identical to characteristics of the SPAD in the detection module.

The current source, which may be connected with the monitoring SPAD, is configured to supply a constant current to the monitoring SPAD so as to operate the monitoring SPAD in Geiger mode. The voltage generation module, which may be connected with the monitoring SPAD, is configured to generate the reverse bias voltage to be applied to the SPAD in the detection module based on (i) a reference breakdown voltage set from a breakdown voltage generated across the monitoring SPAD and (ii) a predetermined excess voltage.

As a result, the SPAD in the detection module receives a reverse bias voltage; the reverse bias voltage is generated based on (i) the reference breakdown voltage estimated to be a breakdown voltage when the SPAD breaks down due to incidence of photons, and (ii) a predetermined excess voltage.

Therefore, even if the breakdown voltage changes due to the temperature change of the SPAD, the excess voltage becomes a substantially predetermined constant voltage. It is thus possible to stabilize the detection sensitivity of photons by the SPAD.

That is, in a light detector using an SPAD, a reverse bias voltage exceeding the breakdown voltage is applied to the SPAD; in response to that photons are incident on an SPAD, a detection signal is output based on the current flowing when the SPAD breaks down.

In contrast, the breakdown voltage of the SPAD changes with temperature. Specifically, the breakdown voltage is higher as the temperature is higher. Therefore, if the reverse bias voltage applied to the SPAD is maintained to be constant, the excess voltage, which is the excess voltage obtained by subtracting the breakdown voltage from the constant reverse bias voltage, becomes lower (decreases) as the temperature becomes higher (increases). The detection sensitivity of the SPAD thereby changes with voltage change of the excess voltage.

Therefore, in the light detector of the present disclosure, the breakdown voltage of the SPAD in the detection module is estimated as the reference breakdown voltage using the monitoring SPAD. The reverse bias voltage is set based on the reference breakdown voltage and the desired excess voltage.

Therefore, the light detector of the present disclosure enables the temperature compensation of the detection sensitivity of the SPAD that is included in the detection module, further enabling the light detection with a desired detection sensitivity without being affected by the temperature change of the SPAD.

What is claimed is:

1. A light detector comprising:
   a detection module including a SPAD (Single Photon Avalanche Diode) that is an avalanche photodiode operable in Geiger mode, the detection module being configured to perform light detection by applying, to the SPAD, a reverse bias voltage in a reverse direction;
   a monitoring SPAD having characteristics identical to characteristics of the SPAD in the detection module;
   a current source configured to supply a constant current to the monitoring SPAD so as to operate the monitoring SPAD in Geiger mode; and
   a voltage generation module configured to generate the reverse bias voltage to be applied to the SPAD in the detection module based on (i) a reference breakdown voltage set from a breakdown voltage generated across the monitoring SPAD and (ii) a predetermined excess voltage,
   wherein (i) the reference breakdown voltage is a positive reference breakdown voltage and (ii) the predetermined excess voltage is a positive excess voltage, or (i) the reference breakdown voltage is a negative reference breakdown voltage and (ii) the predetermined excess voltage is a negative excess voltage, and
   wherein the voltage generation module is configured to generate the reverse bias voltage by
      adding the positive reference breakdown voltage with the positive excess voltage, or
      adding the negative reference breakdown voltage with the negative excess voltage.

2. The light detector according to claim 1, wherein:
   the detection module includes a quenching element connected to a cathode of the SPAD, the quenching element being configured to prevent the SPAD from breaking down upon incidence of photons and performing Geiger discharges; and
   the voltage generation module is configured to apply, to an anode of the SPAD, the reverse bias voltage such that the anode is lower in potential than the cathode.

3. The light detector according to claim 1, wherein:
   the detection module includes a quenching element connected to an anode of the SPAD, the quenching element being configured to prevent the SPAD from breaking down upon incidence of photons and performing Geiger discharges; and
   the voltage generation module is configured to apply, to a cathode of the SPAD, the reverse bias voltage such that the cathode is higher in potential than the anode.

4. The light detector according to claim 1, wherein the monitoring SPAD is shielded and breaks down due to noise.

5. The light detector according to claim 1, wherein a light incident on the monitoring SPAD is smaller than a light incident on the detection module.

6. The light detector according to claim 1, further comprising:
a switch configured to conduct a conduction path from the current source to the monitoring SPAD according to an external command; and
a voltage storage module configured to set and store the reference breakdown voltage from the breakdown voltage of the monitoring SPAD when the switch is conducting the conduction path, and output the reference breakdown voltage to the voltage generation module regardless of whether or not the switch conducts the conduction path or not.

7. The light detector according to claim 1, further comprising:
an excess voltage setting module configured to set the excess voltage based on the reference breakdown voltage of the monitoring SPAD, the excess voltage based on which the voltage generation module generates the reverse bias voltage.

8. The light detector according to claim 1, further comprising:
a reference breakdown voltage setting module includes a plurality of monitoring SPADs, the reference breakdown voltage setting module being configured to set the reference breakdown voltage and supply the set reference breakdown voltage to the voltage generation module by performing calculation or selection using a plurality of breakdown voltages obtained from the plurality of monitoring SPADs.

9. The light detector according to claim 1, further comprising:
an output determination module,
wherein:
the detection module includes a plurality of SPADs; and
the output determination module is configured to
count a specified number of detection signals output from the plurality of SPADs in the detection module, and
determine a detection of a light in response to that the specified number of detection signals is equal to or greater than a predetermined threshold value, outputting a trigger signal.

10. The light detector according to claim 9, further comprising:
a threshold setting module configured to set the threshold value based on the reference breakdown voltage.

11. The light detector according to claim 1, wherein:
the current source is connected with the monitoring SPAD; and
the voltage generation module is connected with a node between the monitoring SPAD and the current source, and separately connected with the detection module.

12. The light detector according to claim 1, further comprising:
a voltage source configured to supply a voltage providing the excess voltage to the voltage generation module, wherein:
the voltage supplied by the voltage source is inputted, separately from the reference breakdown voltage, to the voltage generation module.

13. The light detector according to claim 12, wherein:
the voltage generation module is electrically connected with an anode of the voltage source.

14. The light detector according to claim 1, wherein:
a magnitude of the reverse bias voltage is greater than each of a magnitude of the reference breakdown voltage and a magnitude of the excess voltage.

15. A light detector comprising:
a detection module including an SPAD (Single Photon Avalanche Diode) that is an avalanche photodiode operable in Geiger mode, the detection module being configured to perform light detection by applying, to the SPAD, a reverse bias voltage in a reverse direction;
a monitoring SPAD having characteristics identical to characteristics of the SPAD in the detection module;
a current source configured to supply a constant current to the monitoring SPAD so as to operate the monitoring SPAD in Geiger mode;
a voltage generation module configured to generate the reverse bias voltage to be applied to the SPAD in the detection module based on (i) a reference breakdown voltage set from a breakdown voltage generated across the monitoring SPAD and (ii) a predetermined excess voltage;
a switch configured to conduct a conduction path from the current source to the monitoring SPAD according to an external command; and
a voltage storage module configured to set and store the reference breakdown voltage from the breakdown voltage of the monitoring SPAD when the switch is conducting the conduction path, and output the reference breakdown voltage to the voltage generation module regardless of whether or not the switch conducts the conduction path or not.

16. A light detector comprising:
a detection module including an SPAD (Single Photon Avalanche Diode) that is an avalanche photodiode operable in Geiger mode, the detection module being configured to perform light detection by applying, to the SPAD, a reverse bias voltage in a reverse direction;
a monitoring SPAD having characteristics identical to characteristics of the SPAD in the detection module;
a current source configured to supply a constant current to the monitoring SPAD so as to operate the monitoring SPAD in Geiger mode;
a voltage generation module configured to generate the reverse bias voltage to be applied to the SPAD in the detection module based on (i) a reference breakdown voltage set from a breakdown voltage generated across the monitoring SPAD and (ii) a predetermined excess voltage; and
a reference breakdown voltage setting module includes a plurality of monitoring SPADs, the reference breakdown voltage setting module being configured to set the reference breakdown voltage and supply the set reference breakdown voltage to the voltage generation module by performing calculation or selection using a plurality of breakdown voltages obtained from the plurality of monitoring SPADs.

* * * * *